United States Patent
Mayer

(10) Patent No.: US 12,015,311 B2
(45) Date of Patent: Jun. 18, 2024

(54) DRIVE SYSTEM AND METHOD FOR ACTUATING A DRIVE SYSTEM WITH AN ELECTRIC MOTOR AND ELECTRIC DEVICE

(71) Applicant: SEW-EURODRIVE GMBH & CO. KG, Bruchsal (DE)

(72) Inventor: Ralph Mayer, Ubstadt-Weiher (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 548 days.

(21) Appl. No.: 17/275,353

(22) PCT Filed: Aug. 20, 2019

(86) PCT No.: PCT/EP2019/025277
§ 371 (c)(1),
(2) Date: Mar. 11, 2021

(87) PCT Pub. No.: WO2020/052807
PCT Pub. Date: Mar. 19, 2020

(65) Prior Publication Data
US 2022/0052587 A1    Feb. 17, 2022

(30) Foreign Application Priority Data

Sep. 11, 2018   (DE) .......................... 102018007177.5

(51) Int. Cl.
*H02K 11/33* (2016.01)
*G05B 15/02* (2006.01)
(Continued)

(52) U.S. Cl.
CPC ............. *H02K 11/33* (2016.01); *G05B 15/02* (2013.01); *H02K 11/35* (2016.01); *H05K 5/0026* (2013.01); *H02K 2211/03* (2013.01)

(58) Field of Classification Search
CPC .... H02K 11/33; H02K 11/35; H02K 2211/03; G05B 15/02; G05B 19/0426;
(Continued)

(56) References Cited

U.S. PATENT DOCUMENTS

| 4,556,270 A | 12/1985 | Schuetzle et al. |
| 6,211,639 B1 | 4/2001 | Meister et al. |

(Continued)

FOREIGN PATENT DOCUMENTS

| DE | 4100112 C1 | 12/1991 |
| DE | 19847789 A1 | 4/2000 |

(Continued)

OTHER PUBLICATIONS

English translation of DE-4100112-C1 (Year: 1991).*
(Continued)

*Primary Examiner* — Tulsidas C Patel
*Assistant Examiner* — Joshua Kiel M Rodriguez
(74) *Attorney, Agent, or Firm* — Carter, DeLuca & Farrell LLP

(57) ABSTRACT

In a drive system and a method for actuating a drive system having an electric motor and an electric device, which has an electronic circuit feeding the electric motor, the electric device includes a module, the electric device, e.g., the electronic circuit, being able to be connected to a processor, e.g., an actuation PC, for a data exchange, e.g., for actuating the drive system. The module is inserted into a depression, e.g., a recess, of the electric device, and the module including operable switches, e.g., DIP switches, and a memory for storing first parameters.

18 Claims, 2 Drawing Sheets

(51) Int. Cl.
*H02K 11/35* (2016.01)
*H05K 5/00* (2006.01)

(58) Field of Classification Search
CPC ...... G05B 2219/23356; G05B 19/0423; G05B 2219/25107; G05B 2219/25119; H05K 5/0026; H05K 7/14327; H01R 13/6273
See application file for complete search history.

(56) References Cited

U.S. PATENT DOCUMENTS

| | | |
|---|---|---|
| 9,414,515 B2 | 8/2016 | Kiesel et al. |
| 2002/0047504 A1* | 4/2002 | Takahashi .............. H02K 11/33 310/71 |
| 2005/0021909 A1 | 1/2005 | Much et al. |
| 2009/0070575 A1 | 3/2009 | Ehlich |
| 2012/0210037 A1* | 8/2012 | Kiesel .................. H01R 13/405 710/305 |

FOREIGN PATENT DOCUMENTS

| | | |
|---|---|---|
| DE | 10034791 A1 | 1/2002 |
| DE | 102006051371 A1 | 5/2007 |
| DE | 102007058880 A1 | 6/2009 |
| DE | 102009050232 A1 | 5/2011 |
| EP | 0896265 A1 | 2/1999 |
| EP | 1929380 B1 | 12/2013 |
| WO | 2007006774 A1 | 1/2007 |

OTHER PUBLICATIONS

International Search Report issued in corresponding International Application No. PCT/EP2019/025277, dated Nov. 26, 2019, pp. 1-2, English Translation.
Arora, M. et al., "Understanding embedded-system-boot-techniques" EDN Network (Feb. 2011) pp. 1-7.
European Office Action issued in corresponding EP Application No. 19758894.0, dated Mar. 13, 2023, pp. 1-6.

* cited by examiner

DRIVE SYSTEM AND METHOD FOR ACTUATING A DRIVE SYSTEM WITH AN ELECTRIC MOTOR AND ELECTRIC DEVICE

FILED OF THE INVENTION

The present invention relates to a drive system and to a method for actuating a drive system with an electric motor and an electric device.

BACKGROUND INFORMATION

Certain conventional electric motors are able to be operated in an rpm-controlled manner by an electric device functioning as a converter.

German Patent Document No. 10 2006 051 371 describes a device which has a module, and energy and data are transmittable in a contact-free manner.

German Patent Document No. 10 2007 058 880 describes a converter motor.

German Patent Document No. 10 2009 050 232 describes an electric device.

German Patent Document No. 100 34 791 describes a portable device for a converter.

U.S. Patent Application Publication No. 2005/0021909 describes a memory selector.

European Patent Document No. 1 929 380 describes a method for actuating a drive.

German Patent Document No. 989 47 789 describes a converter production series.

SUMMARY

Example embodiments of the present invention provide a drive system in which the actuation is to be carried out in a simple manner.

According to an example embodiment of the present invention, in a drive system with an electric motor and an electric device, which has an electronic circuit feeding the electric motor, the electric device has a module, the electric device, in particular, the electronic circuit, is able to be connected to a processor, e.g., an actuation PC, for a data exchange, e.g., for the actuation of the drive system, the module is inserted into a depression, e.g., a recess, of the electric device, and the module has operable switches, e.g., DIP switches, and a memory for storing first parameters.

This has the advantage that a simple actuation is able to be carried out. This is because the processor is either connected for a data transmission so that the parameters are comfortably able to be input via its keyboard or on its touch-sensitive screen after a simple menu selection, or it is merely necessary to operate the DIP switches according to the identification on the housing part of the module or according to the operating instructions, and thus in a straightforward manner, so that the parameters stored in the module and also the parameters coded by the switch positions of the DIP switches are conveyed to the electric device and used for the actuation. Plugging the module into the cover part of the electric device can be accomplished because it simply requires the detachment of the cover part and the subsequent insertion of the module into the depression or the recess arranged on the cover part as the receptacle for the module.

According to example embodiments, the electronic circuit has a further memory for storing second parameters, which particularly include the first parameters and also parameters corresponding to the switch positions of the switches. This offers the advantage that the parameters required for the actuation are stored in the further memory. The reason for this is that this further memory is configured to be stable in the long term. The storage of the data written into the memory is therefore permanent and the data are consequently also not at risk in a power failure. If a processor is connected for the data transmission, the parameters it transmits have a higher priority, which thus means that the parameters stored in the further memory and the parameters stored in the module as well as the switch positions of the DIP switches are not used for the actuation.

The further memory can be provided with parameters already during the production of the electric device so that an allocation error related to the design type can be avoided.

In addition, a particularly rapid data transmission is able to be carried out because of the high bandwidth of the data communication channels internally installed in the electric device.

According to example embodiments, the electric device has a cover part in which a circuit board of the electronic circuit is accommodated, and a data line, e.g., for the connection of a processor, or the processor, to the electronic circuit is fed through a cable gland of the cover part or of a connection part or junction box part onto which the cover part is placed.

This offers the advantage that the circuit board is protectively surrounded by the cover part, the cover part being connectable to heat-producing components of the electronic circuit in a thermally conductive manner so that an effective heat dissipation is able to take place if the cover part has cooling fins on its outer side.

According to example embodiments, the module has at least one clip on which a locating lug is provided or premolded, the locating lug, e.g., engaging behind an insulation part, which surrounds the electronic circuit in the manner of a housing together with the cover part. The clip is elastically deflectable relative to the housing part of the module, the clip, e.g., being provided in one piece with or premolded on the housing part of the module. This offers the advantage that the module is able to be connected by a snap-in connection. To this end, the module simply needs to be held by its clips, the clips be pressed towards each other in order to achieve a certain elastic deflection and then be snapped in by introducing the module into the depression.

According to example embodiments, pegs are provided on the housing part of the module, which are introduced into corresponding holes having an elongated shape when the module is inserted into the depression. This has the advantage that a guide is formed when the module is inserted.

According to example embodiments, a plug connector part is mounted on the circuit board, which is plugged into a mating plug connector part situated in a connection part or junction box part onto which the cover part is placed.

According to example embodiments, the electronic circuit includes a selector device, which is appropriately configured so that: if a processor is provided which is connected to the electronic circuit for a data exchange, the parameters transmitted by the processor are used for actuating the electric device; and if this processor is not connected to the electronic circuit for a data exchange, the parameters provided in a further memory of the electronic circuit are used for actuating the electric device; and in the other case, that is to say, if these are not provided, or if the further memory is not provided, the parameters stored in the memory of the module are used for the actuation.

This offers the advantage that the selector device selects the parameters for the actuation according to their priority, in which case the processor has the highest priority, the further memory has a lower priority, and the memory of the module has the lowest priority.

According to an example embodiment of the present invention, in a method for actuating a drive system, the actuation of the electric device: is carried out using parameters stored in a processor if the processor is connected to the electronic circuit for a data exchange; is carried out using parameters stored in a further memory of the electric device if such a further memory is provided and includes parameters for the actuation, and if the processor is not connected to the electronic circuit for a data exchange; the actuation is carried out using parameters stored in the memory of the module if the further memory is not provided or does not include any parameters for the actuation and if the processor is not connected to the electronic circuit for a data exchange.

This offers the advantage that an actuation is able to be carried out in an uncomplicated and safe manner. If a processor is connected, it is used for the actuation, which therefore means that the parameters are input at the processor or its parameters are used. If this actuation option is not available, the parameters are pulled from the further memory already provided in the electric device. If this option is likewise unable to be executed, the parameters stored in the memory of the module are used together with the information about the switch positions of the DIP switches.

According to example embodiments, the electric device has a cover part in which a circuit board of the electronic circuit is accommodated, and a data line, e.g., for connecting the processor to the electronic circuit, is fed through a cable gland of the cover part, the electrical lines leading from the cover part to the connection part or junction box part through a plug connection, the actuation being carried out with the cover part removed, i.e., a severed plug connection. This has the advantage that the cover part is able to be parameterized when the plug connection is severed and the electronic circuit is thus set to the intended operating state without the risk that the motor already starts during the parameterization and actuation. A sufficient energy supply which—although not fully supplying all components of the electronic circuit—at least supplies the components that are required for the parameterization, is implemented via the data line for the data transmission with the processor.

Further features and aspects of example embodiments of the present invention are described in greater detail below with reference to the appended schematic Figures.

DETAILED DESCRIPTION

Figure 1:
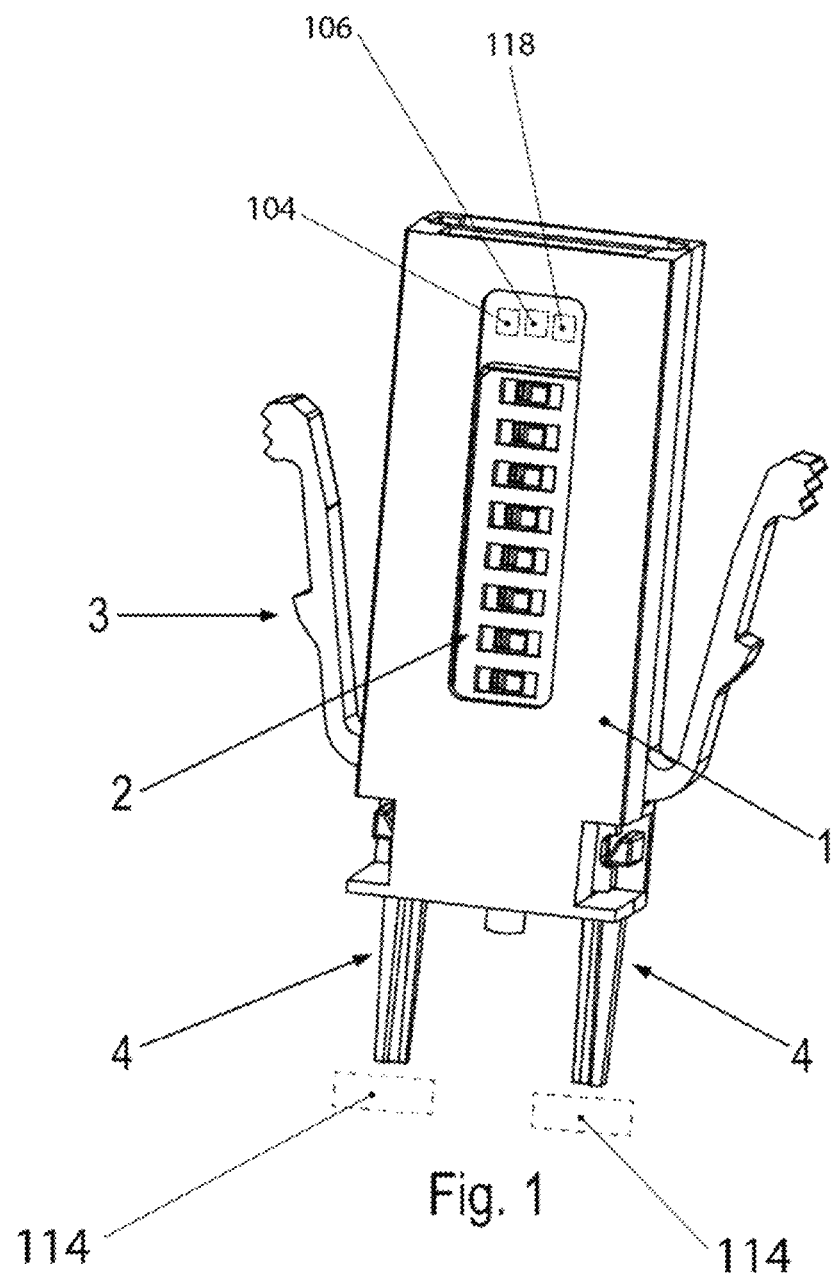
FIG. 1 is a perspective view of a module 1.
Figure 2:
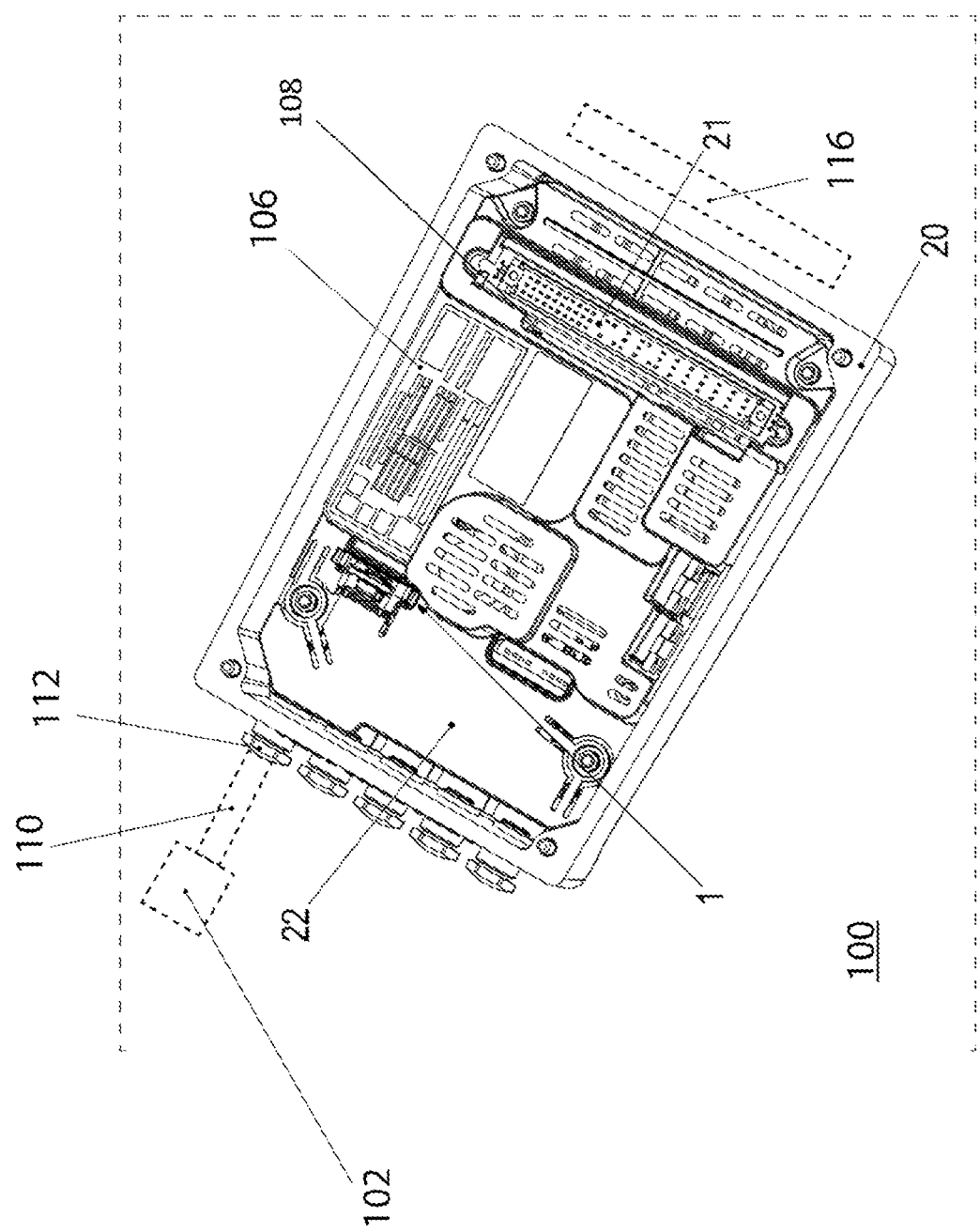
FIG. 2 is a perspective view of a cover part 20 with an inserted module 1.

As schematically illustrated in the Figures, a circuit board 108 on which a plug connector part 21 is mounted is accommodated in a cover part 20.

Cover part 20 may thus be placed on top of a connection part, which has a mating plug connector part 116 that can be plugged into and connected to a corresponding plug connector part 21. This makes it possible to produce an electric device into whose connection part supply lines and data lines are able to be routed, which are electrically connected to contacts of the mating plug connector part so that the electronic circuit situated on the circuit board is electrically supplied.

In the same manner, the data lines may be routed via the plug connection to the electronic circuit or alternatively via sockets situated in the housing wall of cover part 20 whose contacts are electrically connected to circuit traces of the circuit board.

As an alternative, cover part 20 may also be placed on a junction box part of an electric motor 100, which likewise has the functions and equipment features of the connection part. The junction box part is connected to a motor housing part covering the stator of the electric motor, especially is integrally arranged therewith and/or as one part.

An electric motor integrated with the electronic circuit is therefore able to be implemented.

In particular, the electronic circuit has a converter, which supplies an electric motor, or the electric motor. A controlled operation of the electric motor is therefore able to be carried out either as a converter motor when the cover part is placed on the junction box part, or alternatively, with the cover part placed on the connection part, as an electric motor having a converter which is remotely situated in the system, i.e., in the field, and feeds the electric motor.

Module 1 is plugged in on the underside, that is to say, on the side functioning as the inner side once cover part 20 has been placed on top.

Insulation part 22, which substantially covers the circuit board and is connected to the cover part on the side of the circuit board facing plug connector part 21, is provided with a recess for this purpose.

In addition, insulation part 22 has a further recess for plug connector part 21.

Module 1 has a memory 104, 106 which stores parameters for actuating the electronic circuit. In addition, module 1 includes switches 2, e.g., DIP switches. These may be used to set parameter values such as the wiring of the electric motor supplied by the electronic circuit, in which case a star connection or a delta connection as the wiring is able to be coded with the aid of a DIP switch or a plurality of DIP switches. For example, the motor protection code is able to be set using one or more switch(es), that is to say, for example, the type of sensor that is monitoring the temperature of the motor, such as a temperature probe, an NTC thermistor, a PTC thermistor, or PK 1000, for example.

Module 1 also has a clip, i.e., for example, a spring clip, which is fixed in place and/or premolded on the housing part of module 1 and is elastically deflectable relative to the housing part of module 1. On its side facing away from the housing part of the module, the clip has a locating lug so that the locating lug engages behind insulation part 22 when module 1 is inserted into a depression of module 1. This makes it possible to induce a snap-in connection.

Moreover, module 1 has a further clip also on the side of module 1 facing away from clip 3, which is likewise elastically deflectable relative to the housing part and has an oppositely directed locating lug so that module 1 is able to be snapped in on both sides when guided into the depression of cover part 20.

Module 1 thus is able to be snapped into cover part 20.

Pegs 4 are provided on module 1, which are introduced into corresponding holes 114 having an elongated shape when module 1 is inserted into the depression, so that module 1 is able to be inserted into cover part 20 in a controlled manner until the snap-in connection has been induced.

Clips 3 are provided with grooves in their end regions facing away from pegs 4, which are set apart from one another at regular intervals and extend transversely to the plug-in direction of module 1.

In order to allow for an easy detachment of module 1 from cover part 20, the respective locating lug on individual clip 3 is disposed approximately in the center and the respective end region of each clip 3 has a broader configuration and is implemented with a furrowed surface. As a result, greater gripping power is achieved and a lever action, or in other words, clip 3 is able to be elastically pressed in the direction of the housing part, i.e., the base body, of module 1 using little force so that the snap-in connection is able to be released.

When a drive, i.e., of an electric motor supplied by the electronic circuit, is actuated, the electronic circuit, e.g., a control device it includes for carrying out the controlled operation of the electric motor, requires parameters.

When the electronic circuit is connected to a processor 102 situated outside cover part 1 with the aid of the data lines 110, the parameters are transmittable from the processor using a suitable software, or in other words, the electronic circuit is able to be parameterized from the direction of the processor. As noted above, a data line, e.g., for connecting the processor to the electronic circuit, is fed through a cable gland 112 of the cover part.

However, if no such processor is connected to the electronic circuit, then it is checked whether a memory that includes the parameters is provided in the electronic circuit. If such a memory is available, then it is used for the parameterization.

As noted above, for example, the electronic circuit includes a selector device 118, which is appropriately configured so that: if a processor is provided which is connected to the electronic circuit for a data exchange, the parameters transmitted by the processor are used for actuating the electric device; and if this processor is not connected to the electronic circuit for a data exchange, the parameters provided in a further memory of the electronic circuit are used for actuating the electric device; and in the other case, that is to say, if these are not provided, or if the further memory is not provided, the parameters stored in the memory of the module are used for the actuation.

The electrical lines may lead from the cover part to the connection part or the junction box part through a plug connector. Easy servicing is able to be carried out as a result.

In further exemplary embodiments, the housing part serves as a base body on which pegs 4 and clips 3 together with locating lugs are integrally formed, i.e., arranged in one piece.

The invention claimed is:

1. A drive system, comprising:
an electric motor; and
electric device including an electronic circuit adapted to feed the electric motor, the electric device including a module and being connectable to a processor for a data exchange, the module is arranged in a depression of the electric device, the module including operable switches and a memory adapted to store first parameters configured for performing an actuation of the electric device;
wherein pegs are provided on a housing part of the module and are removably insertable into corresponding holes, having an elongated shape, when the module is inserted into the depression, the pegs extending in an insertion direction of the module relative to the holes; and
wherein a clip is provided on each of two opposite sides of the housing part of the module, the clips extending in a direction opposite the insertion direction of the module and being elastically deflectable in a direction toward the housing part, each clip including a locating lug arranged and/or premolded on a side of the clip facing away from the housing part of the module, each locating lug adapted to engage behind an insulation part that surrounds the electronic circuit in the manner of a housing.

2. The drive system according to claim 1, wherein the electronic circuit of the electric device is connectable to the processor for the data exchange.

3. The drive system according to claim 1, wherein the processor includes an actuation PC.

4. The drive system according to claim 1, wherein the electric device is connectable to the processor for the data exchange to actuate the drive system.

5. The drive system according to claim 1, wherein the depression includes a recess.

6. The drive system according to claim 1, wherein the switches include DIP switches.

7. The drive system according to claim 1, wherein the electronic circuit includes a further memory adapted to store second parameters.

8. The drive system according to claim 7, wherein the second parameters include the first parameters and parameters that correspond to switch positions of the switches.

9. The drive system according to claim 1, wherein the electric device includes a cover part, a circuit board of the electronic circuit being accommodated in the cover part, a data line being arranged through a cable gland of the cover part or of a connection part and/or a junction box part onto which the cover part is placed.

10. The drive system according to claim 9, wherein electrical lines lead from the cover part to the connection part and/or the junction box part through a plug connector.

11. The drive system according to claim 9, wherein the data line is adapted to connect to a processor of the electronic circuit.

12. The drive system according to claim 9, wherein a plug connector part is mounted on the circuit board and is plugged into a mating plug connector part situated in a connection part and/or a junction box part onto which a cover part is placed.

13. The drive system according to claim 1, wherein the clip includes grooves.

14. The drive system according to claim 13, wherein the grooves extend transversely to a plug-in connection of the module and are adapted to increase gripping power, the grooves being set apart from one another at uniform and/or regular intervals.

15. The drive system according to claim 13, wherein the grooves are arranged in an end region of a respective clip facing away from pegs provided on a housing part of the module.

16. The drive system according to claim 1, wherein the electronic circuit includes a selector, configured such that: if a processor is provided which is connected to the electronic circuit for a data exchange, parameters transmitted by the processor are used for actuating the electric device; if the processor is not connected to the electronic circuit for a data exchange, parameters provided in a further memory of the electronic circuit are used for actuating the electric device; and if the processor is not provided, or if the further memory is not provided, the parameters stored in the memory of the module are used for the actuation.

17. A method for actuating a drive system as recited in claim 1, comprising:

actuating the electronic device: using parameters stored in a processor if the processor is connected to the electronic circuit for a data exchange; using parameters stored in a further memory of the electric device if a further memory is provided and includes parameters for the actuation, and if the processor is not connected to the electronic circuit for a data exchange; using parameters stored in the memory of the module if the further memory is not provided or does not include any parameters for the actuation and if the processor is not connected to the electronic circuit for a data exchange.

18. The method according to claim 17, wherein the electric device has a cover part in which a circuit board of the electronic circuit is accommodated, a data line connecting the processor to the electronic circuit being fed through a cable gland of the cover part, electrical lines leading from the cover part to a connection part or a junction box part through a plug connection, the actuation being performed with the cover part removed and/or with a severed plug connection.

\* \* \* \* \*